(12) United States Patent
Zhou et al.

(10) Patent No.: US 9,768,726 B2
(45) Date of Patent: Sep. 19, 2017

(54) MAGNETORESISTIVE MIXER

(71) Applicant: Multidimension Technology Co., Ltd., Zhangjiagang (CN)

(72) Inventors: Zhimin Zhou, Zhangjiagang (CN); James Geza Deak, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 62 days.

(21) Appl. No.: 14/907,060

(22) PCT Filed: Jul. 23, 2014

(86) PCT No.: PCT/CN2014/082830
§ 371 (c)(1),
(2) Date: Jan. 22, 2016

(87) PCT Pub. No.: WO2015/010620
PCT Pub. Date: Jan. 29, 2015

(65) Prior Publication Data
US 2016/0164463 A1    Jun. 9, 2016

(30) Foreign Application Priority Data

Jul. 24, 2013 (CN) .......................... 2013 1 0313538

(51) Int. Cl.
*H03D 7/00* (2006.01)
*G01R 33/00* (2006.01)
(Continued)

(52) U.S. Cl.
CPC ........... *H03D 7/00* (2013.01); *G01R 33/0094* (2013.01); *G01R 33/098* (2013.01); *H03D 7/14* (2013.01); *H03D 7/1491* (2013.01)

(58) Field of Classification Search
CPC .......... H03D 7/00; H03D 7/1491; H03D 7/14; G01R 33/094; G01R 33/098
See application file for complete search history.

(56) References Cited

U.S. PATENT DOCUMENTS 7,991,377 B2 * 8/2011 Kakinuma ............... H03D 7/00
327/356
2009/0243698 A1 * 10/2009 Kakinuma ............... H03D 7/00
327/356
(Continued)

FOREIGN PATENT DOCUMENTS

CN    101788596 A    7/2010
CN    102621504 A    8/2012
(Continued)

OTHER PUBLICATIONS

"International Application No. PCT/CN2014/082830, International Search Report and Written Opinion mailed Sep. 26, 2014", (Sep. 26, 2014), 10 pgs.

*Primary Examiner* — Julian Huffman
*Assistant Examiner* — Michael Konczal
(74) *Attorney, Agent, or Firm* — Schwegman Lundberg & Woessner, P.A.

(57) ABSTRACT

A magnetoresistive mixer, comprising a spiral coil, a bridge-type magnetoresistive sensor and a magnetic shielding layer, wherein the spiral coil is located between the bridge-type magnetoresistive sensor and the magnetic shielding layer. Four tunnel magnetoresistive sensor units forming the bridge-type magnetoresistive sensor respectively contain N array-type magnetic tunnel junction rows. The magnetic tunnel junction rows are connected in series, parallel, or combination of series and parallel connections to form two port structures. The four tunnel magnetoresistive sensor units are respectively located in two regions of the spiral coil having opposite current directions, sensing axes of magnetic tunnel junctions are perpendicular to the current directions, and in addition, the distribution characteristics of magnetic fields in directions of the sensing axes of the tunnel magnetoresistive sensor units to the magnetic field in the two regions are opposite, and the distribution characteristics in a (Continued)

single region are the same. The first frequency signal is input through the two ends of the spiral coil, the second frequency signal is input between the power and -ground ports of the bridge-type magnetoresistive sensor, and mixing signals are output through a signal output end of the bridge-type magnetoresistive sensor. The magnetoresistive mixer has the characteristics of good linearity, good input signal isolation, and low power consumption.

13 Claims, 8 Drawing Sheets

(51) Int. Cl.
    *G01R 33/09*     (2006.01)
    *H03D 7/14*     (2006.01)

(56) References Cited

U.S. PATENT DOCUMENTS

2012/0025819 A1    2/2012  Phan Le et al.
2014/0057581 A1*  2/2014  Kakinuma ............... H03D 7/00
                                                          455/191.1

FOREIGN PATENT DOCUMENTS

| CN | 102680009 | 9/2012 |
|---|---|---|
| CN | 103384141 | 11/2013 |
| CN | 203482163 | 3/2014 |
| WO | WO-2015010620 | 1/2015 |

* cited by examiner though a spiral coil is converted to a magnetic field signal, another frequency signal is converted to a power signal to act upon the magnetoresistive sensor, the output signal of the magnetoresistive sensor is then a multiplication signal of two signals frequencies, the frequency content of the resulting signal is the sum or the difference thereof, there are no other redundant signals, and thus a filter and other elements are not required. Since the spiral coil and the magnetoresistive sensor are coupled by using a magnetic field, effective isolation between the input signals and between the input signals and the output signals is achieved. In addition, the magnetoresistive sensor further has the characteristics of low power consumption and high magnetic field sensitivity, and thus the current used to provide the magnetic field need not be too large in order to provide a large output signal, all of which ensure low power consumption and low noise.

MAGNETORESISTIVE MIXER

PRIORITY CLAIM TO RELATED APPLICATIONS

This application is a U.S. national stage application filed under 35 U.S.C. §371 from International Application Serial No. PCT/CN2014/082830, which was filed 23 Jul. 2014, and published as WO2015/010620 on 29 Jan. 2015, and which claims priority to Chinese Application No. 201310313538.3, filed 24 Jul. 2013, which applications and publication are incorporated by reference as if reproduced herein and made a part hereof in their entirety, and the benefit of priority of each of which is claimed herein.

TECHNICAL FIELD

The present invention relates to the field of magnetic sensor technologies, and in particular, to a magnetoresistive mixer.

BACKGROUND ART

A mixer refers to an electronic device that converts an input signal with a frequency of f1 and an input signal with a frequency of f2 to an output signal having characteristic frequencies of f1+f2 and f1−f2. Through the mixer, the frequency of an input signal can be shifted to a higher frequency or a lower frequency value, so as to facilitate signal processing. For example, the frequency of a signal can be shifted by a mixer, in order to separate the signal from a noise signal, then noise can be filtered out using a filter, and the frequency of the signal is then shifted back to the original value using a mixer, in order to provide noise signal processing. Therefore, the mixers are widely used in signal processing circuit technologies.

Mixers used currently include two types, i.e., a passive type and an active type. The passive mixer uses one or more diodes, and achieves a multiplying operation by using nonlinear segments of the current-voltage characteristic curve of the diodes which has an approximately quadratic character, in operation, the sum of two input signals acts upon the diodes, and an output signal including the product of the two input signals can be obtained by further converting the diode current signals output to voltage signals.

The active mixer uses a multiplier (e.g., a transistor or a vacuum tube) to increase strength of the product signal, by mixing an input signal at a frequency with a local frequency, producing an output signal with frequency components including the addition and subtraction of the two frequencies, and the active mixer increases the degree of isolation of two input ends, but it may have higher noise and greater power consumption.

The above mixers have the following problems:

1) The diode mixer uses an approximate processing method, such that the output signal, in addition to including a desired frequency, also has other frequencies, and these have signal strength that is relatively great; it is thus necessary to subsequently use a filter or other technologies to separate the interference in order to provide the desired signal.

2) The active mixer achieves frequency mixing by using a local oscillator, the output signal includes many other frequencies, it is also necessary to use a filter for separation, and it is necessary to use a multiplier, a local oscillator and other devices, which increases complexity and power consumption of the circuit.

3) The input signals and the output signals cannot be effectively isolated, and they will affect each other.

SUMMARY OF THE INVENTION

In order to solve the above existing problems, the present invention describes a magnetoresistive mixer, wherein, by using the characteristic that the resistance of the magnetoresistive sensor is linearly proportional to changes of external magnetic fields, one frequency signal therein flowing through a spiral coil is converted to a magnetic field signal, another frequency signal is converted to a power signal to act upon the magnetoresistive sensor, the output signal of the magnetoresistive sensor is then a multiplication signal of two signals frequencies, the frequency content of the resulting signal is the sum or the difference thereof, there are no other redundant signals, and thus a filter and other elements are not required. Since the spiral coil and the magnetoresistive sensor are coupled by using a magnetic field, effective isolation between the input signals and between the input signals and the output signals is achieved. In addition, the magnetoresistive sensor further has the characteristics of low power consumption and high magnetic field sensitivity, and thus the current used to provide the magnetic field need not be too large in order to provide a large output signal, all of which ensure low power consumption and low noise.

The magnetoresistive mixer for mixing the frequency of a first signal source input and the frequency of a second signal source input to obtain a mixing signal proposed in the present invention includes:

a spiral coil, a bridge-type magnetoresistive sensor and a magnetic shielding layer, wherein the spiral coil is located between the magnetic shielding layer and the bridge-type magnetoresistive sensor; the bridge-type magnetoresistive sensor includes four magnetoresistive sensor units forming a bridge-type structure, the magnetoresistive sensor units being respectively located, in pairs, in two regions above or below portions of the spiral coil having opposite current directions; each of the magnetoresistive sensor units includes N array-type magnetic tunnel junction rows, wherein each array-type magnetic tunnel junction row consists of M magnetic tunnel junctions, M and N are both positive integers, the array-type magnetic tunnel junction rows are connected in series, parallel or combination of series and parallel to form two port structures, and sensing axes of the magnetic tunnel junctions are perpendicular to the current directions in the spiral coil within the region where the magnetoresistive sensor unit is located; in two of the regions, the orientations of magnetic fields in along the sensing axes of the magnetic tunnel junctions in the magnetoresistive sensor units are opposite, while in one of the regions, the orientations of magnetic fields along the sensing axes of the magnetic tunnel junctions in the magnetoresistive sensor units are the same; the first frequency signal source is input through the spiral coil, so as to convert the first frequency signal source to a magnetic field signal having the same frequency as that of a magnetic field in the direction of the sensing axis of the magnetic tunnel junctions and act upon the magnetic tunnel junctions, causing resistances of the magnetoresistive sensor units to change, and the second frequency signal source is input through a power source-ground port of the bridge-type magnetoresistive sensor, causing voltages on two ends of the magnetoresistive sensor units to change: and the mixing signal is output through a signal output end of the bridge-type magnetoresistive sensor, and the signal frequency of the output mixing signal is the sum or the difference of the frequencies of the first frequency signal source and the second frequency signal source.

Preferably, the four magnetoresistive sensor units have the same resistance-magnetic field characteristics.

Preferably, the magnetoresistive sensor units located in the two regions have the same magnetic tunnel junction connection structure, and are opposite in phase.

Preferably, within a range of a magnetic field produced by the first frequency signal source through the spiral coil, the resistances of the magnetic tunnel junctions in the magnetoresistive sensor units are linearly proportional to external magnetic fields.

Preferably, a magnetic field in the direction of the sensing axis of the array-type magnetic tunnel junction rows in the single magnetoresistive sensor unit located above or below the spiral coil is distributed uniformly or non-uniformly.

Preferably, the array-type magnetic tunnel junction rows of the magnetoresistive sensor units located in the regions above or below the spiral coil are perpendicular or parallel to the current directions in the spiral coil within the regions.

Preferably, the first frequency signal source is connected with the spiral coil in an active or passive manner.

Preferably, the second frequency signal source is connected between a voltage port and a ground port of the bridge-type magnetoresistive sensor in a passive or an active manner.

Preferably, the mixing signal is output from the signal output end of the bridge-type magnetoresistive sensor in a passive or an active manner.

Preferably, the spiral coil is made of such a high conductivity metal material such as copper, gold, or silver.

Preferably, the constituent material of the magnetic shielding layer is one selected from the group consisting of high permeability ferromagnetic alloys NiFe, CoFeSiB, CoZrNb, CoFeB, FeSiB and FeSiBNbCu.

Preferably, the spiral coil has a thickness of 1 μm to 20 μm and a width of 5 μm to 40 μm, and the spacing between two adjacent coil turns is 10 μm to 100 μm.

Preferably, the magnetic shielding layer has a thickness of 1 μm to 20 μm.

BRIEF DESCRIPTION OF THE DRAWINGS

In order to illustrate the technical solutions of the technical embodiments of the present invention more clearly, the accompanying drawings to be used for describing the technical embodiments are introduced briefly in the following. Obviously, the accompanying drawings in the following description only provide some of the possible embodiments of the present invention; persons of ordinary skill in the art can obtain other drawings in accordance with the accompanying drawings without providing any creative effort.

DETAILED DESCRIPTION OF THE PREFERRED EMBODIMENTS

The present invention is described below in detail with reference to the accompanying drawings and in combination with various embodiments.

Embodiment 1

Figure 1:
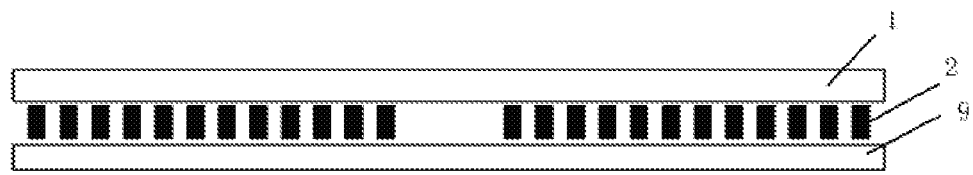
FIG. 1 is a sectional view of a magnetoresistive mixer according to the present invention.

FIG. 1 is a sectional view of a magnetoresistive mixer, which includes a magnetic shielding layer 1, a spiral coil 2 and a bridge-type magnetoresistive sensor 9, wherein the spiral coil 2 is located between the magnetic shielding layer 1 and the bridge-type magnetoresistive sensor 9. In this embodiment, according to the direction shown in FIG. 1, the bridge-type magnetoresistive sensor 9 is located below the spiral coil 2. Certainly, it is also feasible to adopt a solution where the bridge-type magnetoresistive sensor 9 is located above the spiral coil 2.

The spiral coil is made of a high conductivity metal material (e.g., copper, gold, silver or the like), and it has a thickness of 1 µm to 20 µm and a width of 5 µm to 40 µm, where the spacing between two adjacent single coils is 10 µm to 100 µm.

The magnetic shielding layer is made of a high permeability ferromagnetic alloy (e.g., NiFe, CoFeSiB, CoZrNb, CoFeB, FeSiB, FeSiBNbCu or the like), and has a thickness of 1 µm to 20 µm.

Figure 2:
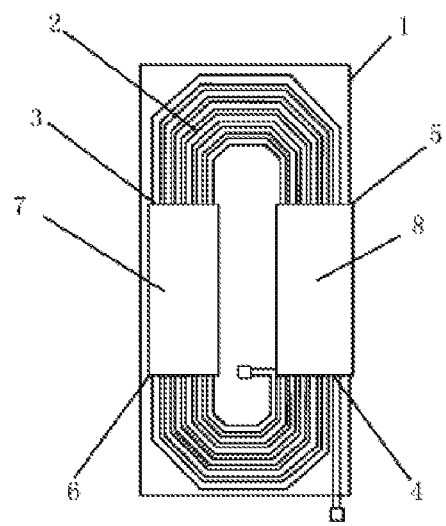
FIG. 2 is a top view of the magnetoresistive mixer according to the present invention.
Figure 3:
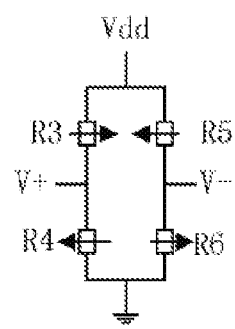
FIG. 3 is a schematic view of a bridge-type magnetoresistive sensor in the magnetoresistive mixer according to the present invention.

FIG. 2 is a top view of the magnetoresistive mixer. The bridge-type magnetoresistive sensor 9, as shown in FIG. 3, includes four magnetoresistive sensor units R3, R6, R4 and R5 that form a bridge-type structure, the magnetoresistive sensor units are respectively located, in pairs, in two regions 7 and 8 of the surface of the spiral coil 2 having opposite current directions, that is, the magnetoresistive sensor units R3 and R4 located in the same half bridge are respectively located in region 7 and region 8, and the magnetoresistive sensor units R5 and R6 located in the other half bridge are respectively located in region 8 and region 7. Region 7 is also divided into a sub-region 3 including the magnetoresistive sensor unit R3 and a sub-region 6 including the magnetoresistive sensor unit R6; and region 8 is also divided into a sub-region 4 including the magnetoresistive sensor unit R4 and a sub-region 5 including the magnetoresistive sensor unit R5. The bridge-type magnetoresistive sensor 9 requires the four magnetoresistive sensor units R3, R6, R4 and R5 to have the same resistance response to the external magnetic field, and in regions 7 and 8, the magnetic field distribution of the magnetoresistive sensor units R3 and R6 as well as R4 and R5 has opposite polarity, but in the sub-regions 3 and 6, magnetic field distribution of the magnetoresistive sensor units R3 and R6 has the same polarity, and in the sub-regions 4 and 5, magnetic field distribution of the magnetoresistive sensor units R4 and R5 has the same polarity.

Figure 4:
FIG. 4 is a view of the distribution of a magnetic field in the vicinity of a spiral coil and a magnetic shielding layer in the magnetoresistive mixer according to the present invention.
Figure 5:
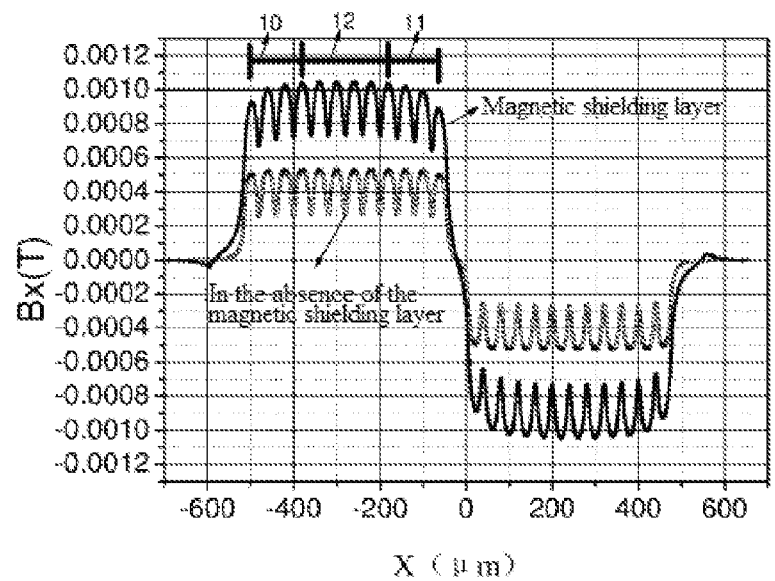
FIG. 5 is a view of the distribution of magnetic field components perpendicular to the directions of the currents in the spiral coil in the presence or in the absence of a magnetic shielding layer in the magnetoresistive mixer according to the present invention.

FIG. 4 is a view of a curve of distribution of a magnetic field produced by the spiral coil 2 and the magnetic shielding layer 1, from which it can be seen that, after an electromagnetic field produced by the spiral coil 2 passes through the magnetic shielding layer 1, the magnetic flux lines are concentrated, indicating that the magnetic field is increased. FIG. 5 is a view of distribution of magnetic field components perpendicular to the current directions in regions 7 and 8 at the surface of the spiral coil 2 where the bridge-type magnetoresistive sensor 9 is placed under two conditions, i.e., in the presence of the magnetic shielding layer 1 and in the absence of the magnetic shielding layer 1, and it can be seen from FIG. 5 that, after the magnetic shielding layer 1 is applied, the intensity of magnetic field thereof is significantly increased. In addition, the magnetic field distribution is antisymmetric in regions 7 and 8, directions of the magnetic field at the surface of the spiral coil 2 and at a distance from the spiral coil 2 are opposite, and the magnetic field in regions 10 and 11 close to the centre of symmetry and edges of the spiral coil 2 is non-uniformly distributed while it has a uniform distribution in an intermediate region 12.

Figure 6:
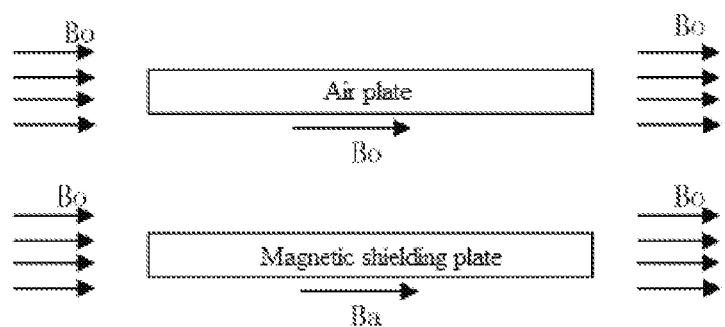
FIG. 6 illustrates amodel of the attenuation of a parallel external magnetic field produced by the magnetic shielding layer of the magnetoresistive mixer according to the present invention.
Figure 7:
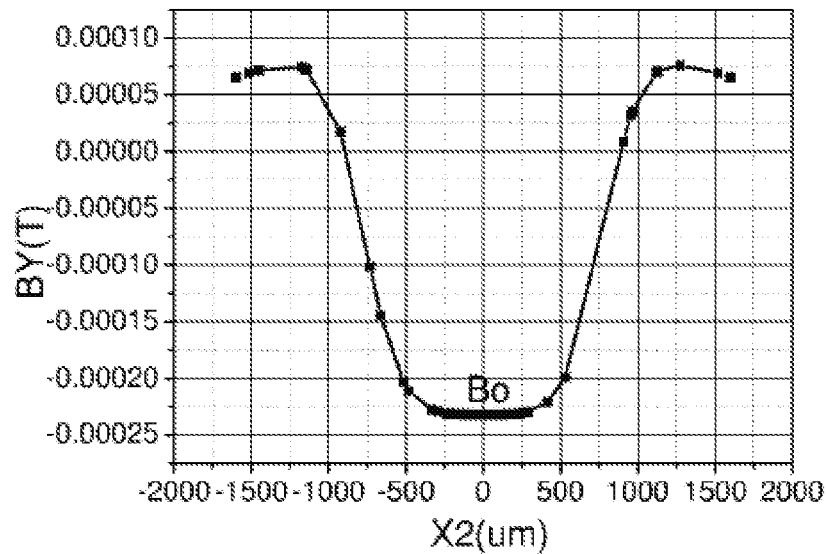
FIG. 7 illustrates a magnetic field distribution curve of the magnetoresistive mixer according to the present invention in produced by an air shielding layer (i.e., without a shielding layer)
Figure 8:
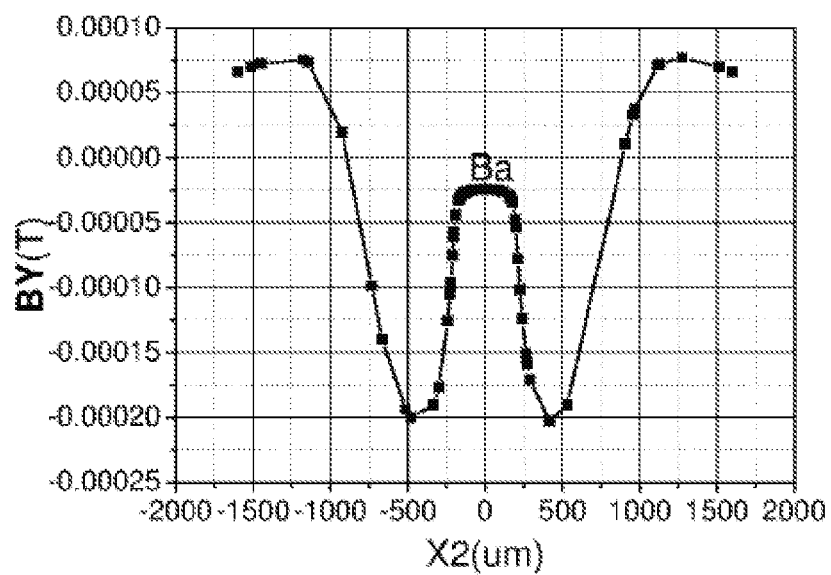
FIG. 8 illustrates a magnetic field distribution curve of the magnetoresistive mixer according to the present invention produced by a magnetic shielding layer.
Figure 9:
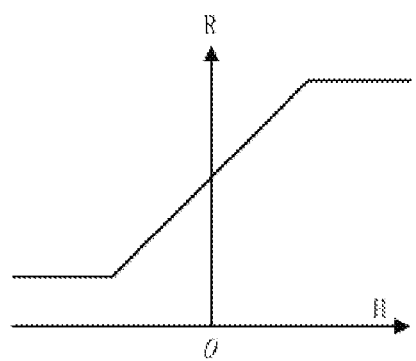
FIG. 9 is a view of a magnetoresistive-external magnetic field characteristic curve of magnetic tunnel junctions in the magnetoresistive mixer according to the present invention.

FIG. 6 illustrates a model of calculating an attenuation ratio of an in-plane external magnetic fields parallel to the magnetic shielding layer 1, and in the model, the magnetic shielding layer 1 and an air layer are respectively placed in a magnetic field parallel to the magnetic shielding layer 1 produced by a Helmholtz coil (not shown). FIG. 7 is a view of the distribution of a magnetic field produced by the Helmholtz coil at the position of the bridge-type magnetoresistive sensor 9 in the absence of the magnetic shielding layer 1, FIG. 8 is a view of the distribution of a magnetic field produced by the Helmholtz coil at the position of the bridge-type magnetoresistive sensor 9 in the presence of the magnetic shielding layer 1, and it can be seen by comparing FIG. 7 and FIG. 8 that the magnetic field attenuation ratio is 1/9, indicating that the magnetic shielding layer 1 provides good shielding of the external magnetic fields. This embodiment is only intended to describe influences on the external magnetic fields in the presence or in the absence of a shielding layer and is irrelevant to the coil used, and thus the conclusion arrived at also applies to the spiral coil 2 in the present invention. FIG. 9 illustrates a curve of magnetoresistive response of the magnetic tunnel junctions forming the magnetoresistive sensor units R3, R4, R5 and R6, where, in a working region the response is linearly proportional to the magnetic field produced by the spiral coil 2 shown in FIG. 4.

Figure 10:
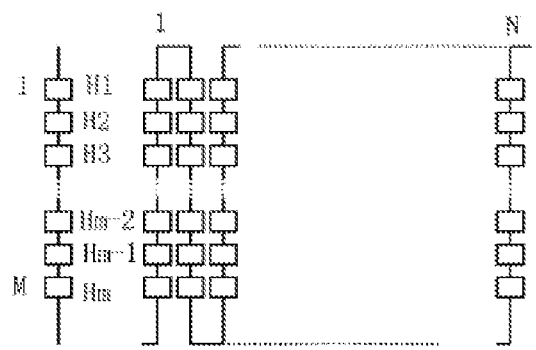
FIG. 10 is a schematic view of a magnetoresistive sensor unit formed by N lines of magnetic tunnel junctions connected in series in the magnetoresistive mixer according to the present invention.
Figure 11:
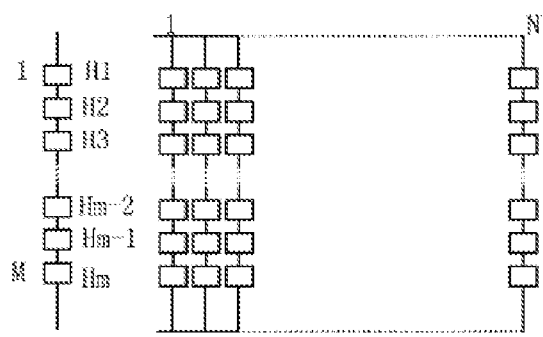
FIG. 11 is a schematic view of a magnetoresistive sensor unit formed by N lines of magnetic tunnel junctions connected in parallel in the magnetoresistive mixer according to the present invention.
Figure 12:
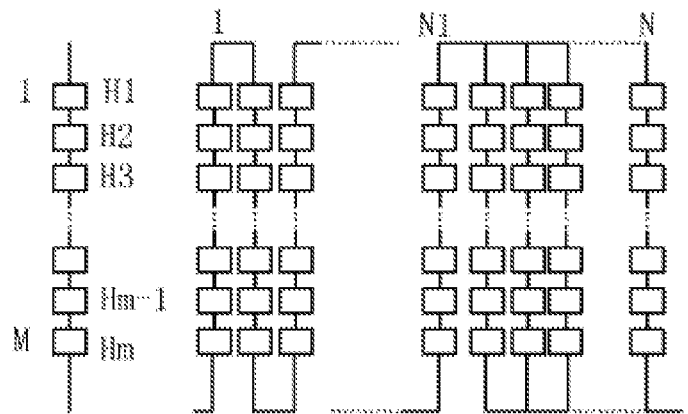
FIG. 12 is a schematic view of a magnetoresistive sensor unit formed by N lines of magnetic tunnel junctions connected in a combination of series connections and parallel connections in the magnetoresistive mixer according to the present invention.
Figure 13:
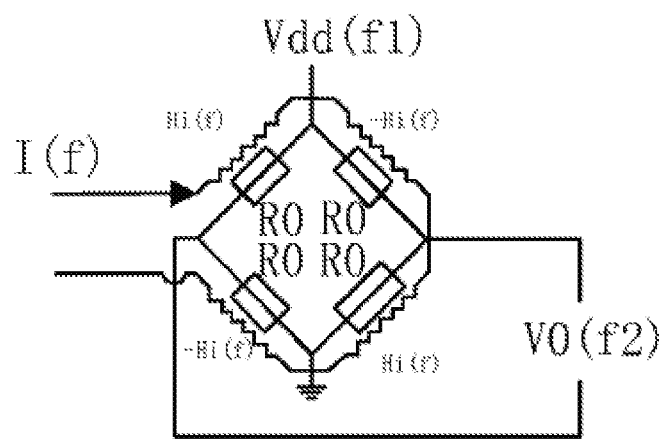
FIG. 13 illustrates the working principle of the magnetoresistive mixer of the present invention.

FIGS. 10-12 are structural views of the magnetoresistive sensor units R3, R4, R5 and R6, each magnetoresistive sensor unit includes N (N is a positive integer) array-type magnetic tunnel junction rows, each array-type magnetic tunnel junction row is formed by M (M is a positive integer) magnetic tunnel junctions, and each row of array-type magnetic tunnel junction rows are in connected in series as shown in FIG. 11 or in parallel as shown in FIG. 12 or in combination of series and parallel connections as shown in FIG. 13. The magnetoresistive sensor units in the regions 7 and 8 have the same magnetic tunnel junction connection structure but are opposite in phase, a magnetic field in the direction of the sensing axis of array-type magnetic tunnel junction rows in a single magnetoresistive sensor unit located above or below the spiral coil has uniform or non-uniform magnetic field distribution, and the array-type magnetic tunnel junction rows in a single magnetoresistive sensor unit located above or below the spiral coil are perpendicular or parallel to the current directions in the spiral coil 2 within region 7 or 8 where the single magnetoresistive sensor unit is located.

FIG. 13 provides an illustration of the working principle of the magnetoresistive mixer, a first frequency signal source with a frequency of f1 is input through the spiral coil 2 to cause a current I to flow through the spiral coil 2, and a magnetic field signal H generated in the spiral coil 2 has a corresponding frequency of f1. Since the corresponding four magnetoresistive sensor units R3 and R6 as well as R5 and R4 in the sub-regions 3, 6 and 5, 4 respectively have antisymmetric magnetic field distributions while magnetic field distributions at the magnetoresistive sensor units R3 and R6 as well as R5 and R4 are the same in pairs, it is only necessary to analyze a resistance change of one magnetoresistive sensor units therein under the action of the magnetic field.

It is assumed that the slope of the resistance-magnetic field curve of the magnetic tunnel junctions shown in FIG. 9 is dR/dh, suppose that, in the N lines of array-type tunnel junction rows of the magnetoresistive sensor unit R3 in the bridge-type magnetoresistive sensor 9, each row includes M (M is a positive integer) magnetic tunnel junctions connected in series. Suppose that a magnetic field in the direction of the sensing axis of the mth (0<m≤M) magnetic tunnel junction in the nth (0<n≤N) row is $H_{nm} \sin(2\pi f_2 t)$, wherein $H_{nm}$ is the amplitude of the magnetic field in the direction of the sensing axis, and the amplitude of the resistance change is $dR/dh \cdot H_{nm} \sin(2\pi f_2 t)$. Owing to antisymmetry of the magnetic field of the spiral coil 2, the magnetoresistive sensor unit R4 definitely has a corresponding magnetic tunnel junction, of which the reverse magnetic field in the direction of the shaft is $-H_{nm} \sin(2\pi f_2 t)$, and the corresponding resistance change is $-dR/dh \cdot H_{nm} \sin(2\pi f_2 t)$, therefore, the total resistance of the half bridge formed by the bridge-type magnetoresistive sensor units R3 and R4 is constant, and the same situation applies to the half bridge formed by the magnetoresistive sensor units R5 and R6.

Therefore, the resistance change of the magnetic tunnel junction rows formed in series connection or parallel connection is directly proportional to the frequency f1 of the current I, and is relevant to distribution of the magnetic field in the direction of the sensing axis $H_{nm}$ at the magnetic tunnel junction rows.

On the other hand, the magnetic field in the direction of the sensing axis $H_{nm}$ is directly proportional to the current I in the spiral coil 2, that is, $H_{nm} = K_{nm} \cdot I$, wherein $K_{nm}$ is a characteristic coefficient relevant to electromagnetic properties and geometrical dimensions of the spiral coil 2 and the magnetic shielding layer 1.

Therefore, the structures of series connection, parallel connection and combination of series connection and parallel connection between the tunnel junction rows are merely expressed as operations between the characteristic coefficients $K_{nm}$. In the case of the series connection between the N lines, a characteristic factor of the magnetoresistive sensor unit R3 is expressed as:

$$K = \sum_{n=1}^{N} \sum_{m=1}^{M} K_{nm}$$

In the case of the parallel connection between the N lines, the characteristic factor is expressed as:

$$K = \frac{1}{\sum_{n=1}^{N} \frac{1}{\sum_{m=1}^{M} K_{nm}}}$$

In the case of the combination of series connection and parallel connection, suppose that N1 rows are in series connection and N-N1 rows are in parallel connection, the characteristic factor K may be expressed as:

$$K = \sum_{n=1}^{N1} \sum_{m=1}^{M} K_{nm} + \frac{1}{\sum_{n=1}^{N-N1} \frac{1}{\sum_{m=1}^{M} K_{nm}}}$$

The change of the total resistance of the magnetoresistive sensor unit R3 is:

$$\nabla R = I \frac{dR}{dt} \sin(2\pi f_1 t) K$$

Suppose that, in the absence of an external magnetic field, the total resistance of the magnetoresistive sensor unit is $R_0$ and voltages on the two ends of the voltage-ground of the bridge-type magnetoresistive sensor 9 are $V_{dd}$, the current flowing through a single arm is $$I = \frac{V_{dd}}{2R_0}.$$

Since the total resistance of the two half bridges is constant, the output voltage signal of the bridge-type magnetoresistive sensor is:

$$\nabla V = 2 \frac{V_{ed}}{2R_0} \nabla R = \frac{V_{dd}}{R_0} I \frac{dR}{dh} \sin(2\pi f_1 t) K$$

Suppose that the power source-voltage characteristic frequency of the bridge-type magnetoresistive sensor 9 is f, and has the following form:

$V_{dd} = V_m \cdot \sin(2\pi ft)$, wherein $V_m$ is the amplitude of $V_{dd}$, the output voltage signal of the bridge-type magnetoresistive sensor is:

$$\nabla V = \frac{V_{dd}}{R_0} I \frac{dR}{dh} \sin(2\pi f_1 t) K = I \frac{V_m}{R_0} \cdot \frac{dR}{dh} \cdot K \cdot \sin(2\pi ft) \cdot \sin(2\pi f_1 t)$$

It can be seen that the frequency of the output signal is the sum or the difference of the frequency f1 of the current I in the spiral coil 2 and the frequency f of the power source-ground voltage $V_{dd}$ of the bridge-type magnetoresistive sensor 9, and does not include other frequencies. Hence, the first frequency signal source to be mixed is input through the spiral coil 2, the second frequency signal source is input through a power source-ground port of the bridge-type magnetoresistive sensor 9, and the mixing signal obtained is output through a signal output end of the bridge-type magnetoresistive sensor 9.

In the case of the uniform field, $H_m = K_m l$, $K_m$ are the same, and in the case of the series connection:

$$K = \sum_{n=1}^{N} \sum_{m=1}^{M} K_{nm} = N \cdot M \cdot K_m$$

In the case of the parallel connection:

$$K = \frac{1}{\sum_{n=1}^{N} \frac{1}{\sum_{m=1}^{M} K_{nm}}} = \frac{M \cdot K_n}{N}$$

In the case of the combination of series connection and parallel connection:

$$K = \sum_{n=1}^{N_1} \sum_{m=1}^{M} K_{nm} + \frac{1}{\sum_{n=1}^{N-M_1} \frac{1}{\sum_{m=1}^{M} K_{nm}}} = K_m \left( N_1 \cdot M + \frac{M \cdot K_m}{N - N_1} \right)$$

Figure 14:
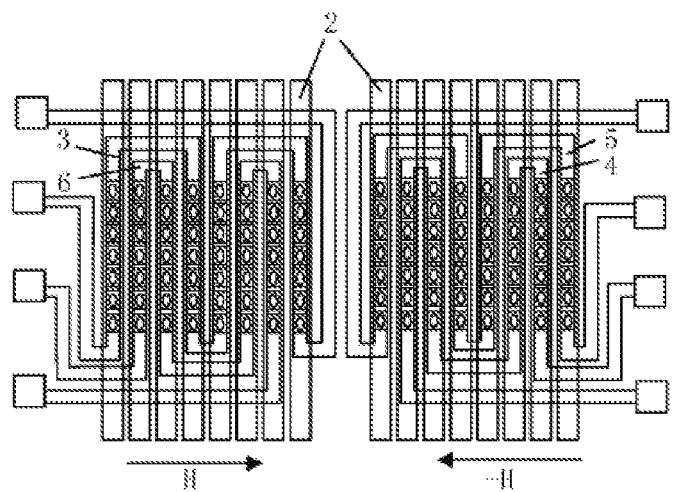
FIG. 14 is a view of arrangement of positions of the magnetoresistive sensor units and the spiral coil in a uniform magnetic field region in the magnetoresistive mixer according to the present invention.

FIG. 14 is a view of arrangement of the bridge-type magnetoresistive sensor 9 on the spiral coil 2 within the uniform field region 13 of the spiral coil 2. The magnetoresistive sensor units R3, R6 and R4, R5 are respectively located in two regions 7 and 8 on an upper surface or a lower surface of the spiral coil 2 having opposite current directions, and the magnetoresistive sensor units in the two regions have antisymmetric geometric characteristics, the magnetic tunnel junction rows in the magnetoresistive sensor units R3, R5, R4 and R6 are located in the center of a surface of an energized segment of the spiral coil 2 and parallel to the current directions, the array-type tunnel junction rows in the magnetoresistive sensor units R3 and R6 as well as R4 and R5 are arranged in intervals, and a sensing axis of the magnetic tunnel junctions is perpendicular to a conductive segment of the spiral coil 2.

The magnetic tunnel junctions in the magnetoresistive sensor units may also be arranged in other manners.

Figure 15:
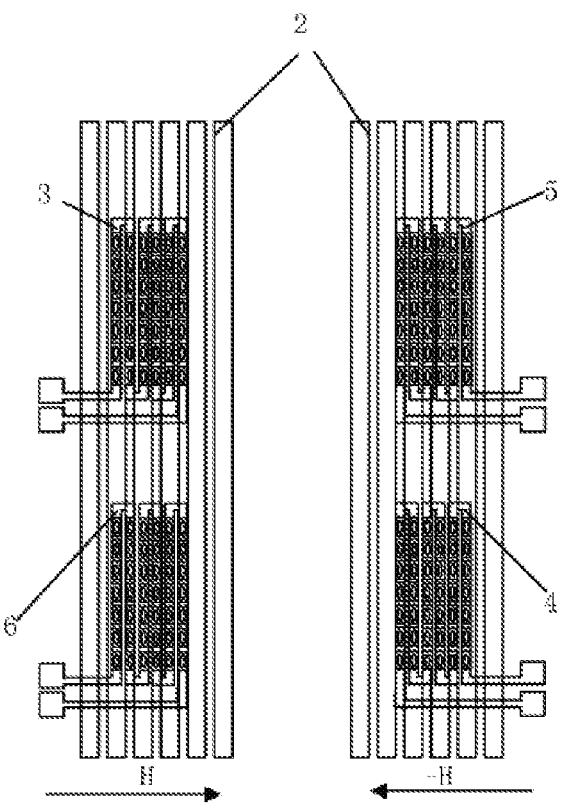
FIG. 15 is a view of arrangement of parallel positions of the magnetoresistive sensor units and the spiral coil in a magnetic field region in the magnetoresistive mixer according to the present invention.
Figure 16:
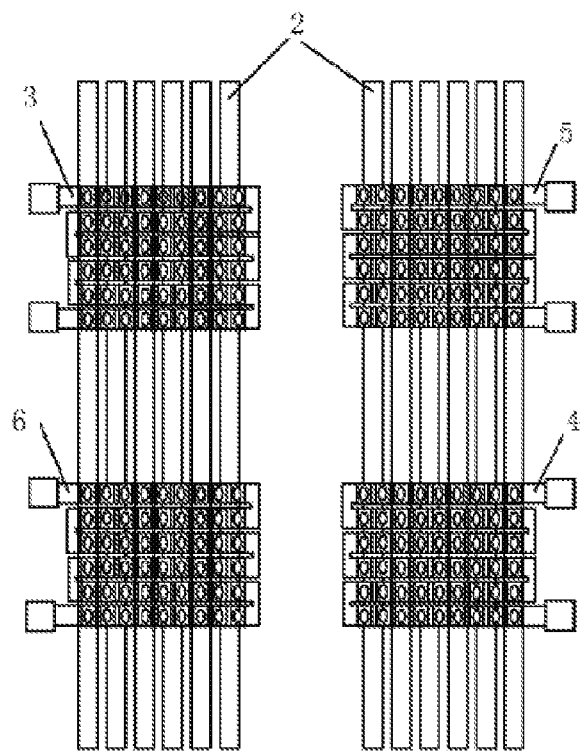
FIG. 16 is a view of arrangement of vertical positions of the magnetoresistive sensor units and the spiral coil in the magnetic field region in the magnetoresistive mixer according to the present invention.

FIGS. 15-16 are views of arrangement of the bridge-type magnetoresistive sensor 9, which is on an upper surface or a lower surface of the spiral coil 2, on the spiral coil 2. The magnetoresistive sensor units R3, R6 and R4, R5 are respectively located in two regions 7 and 8 on the upper surface or the lower surface of the spiral coil 2 having opposite current directions, and the magnetoresistive sensor units in the two regions have antisymmetric geometric characteristics. Moreover, structures of the magnetoresistive sensor units R3 and R4 as well as R5 and R6 have antisymmetric characteristics, and at this point, the structures of R3 and R6 are completely the same and the structures of R4 and R5 are completely the same. In addition, the distribution of magnetic fields in directions of the shafts of the magnetic tunnel junctions of N lines of array-type tunnel junction units in the magnetoresistive sensor units in the sub-regions 3 and 6 as well as 4 and 5 are completely the same, and the sub-regions 3 and 4 as well as 5 and 6 have antisymmetric magnetic field distribution characteristics. Each magnetoresistive sensor unit includes N lines of array-type magnetic tunnel junction rows, the array-type tunnel junction rows are connected in the form of series connection, parallel connection or combination of series connection and parallel connection to form two port structures, the row of the magnetoresistive sensor is parallel to the row of the corresponding spiral coil or perpendicular to the row of the spiral coil, a sensing axis of the magnetic tunnel junctions is perpendicular to the spiral coil, and at this point, the magnetoresistive sensor units may be located in a uniform region of the magnetic field, may be located in a non-uniform region of the magnetic field, and may also partially located in a uniform region of the magnetic field and partially located in a non-uniform region of the magnetic field.

The first frequency signal source is connected with the spiral coil in an active or passive manner; the second frequency signal source is connected between a voltage port and a ground port of the bridge-type magnetoresistive sensor in a passive or active manner; and the mixing signal is output from the signal output end of the bridge-type magnetoresistive sensor in a passive or active manner.

Figure 17:
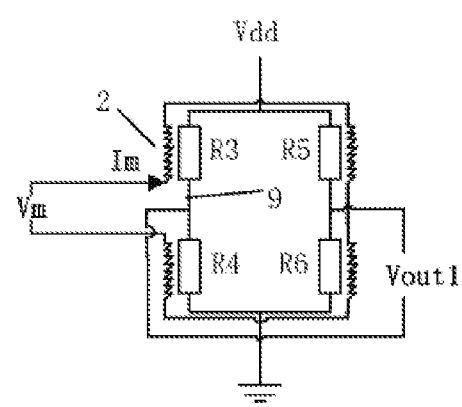
FIG. 17 is a view of a signal processing circuit of the mixer when the magnetoresistive mixer of the present invention uses passive coil signals, passive power signals, and a passive output signal.

FIG. 17 is a view of a signal processing circuit of the magnetoresistive mixer, wherein first frequency signal source having frequency f1 is directly connected with two ends of the spiral coil 2 in a passive form, the second frequency signal source with frequency f is directly input between the power source and ground ports of the bridge-type magnetoresistive sensor 9 in a passive form, and the frequency of the mixing signal is output through the signal output end of the bridge-type magnetoresistive sensor 9 directly in a passive form.

Figure 18:
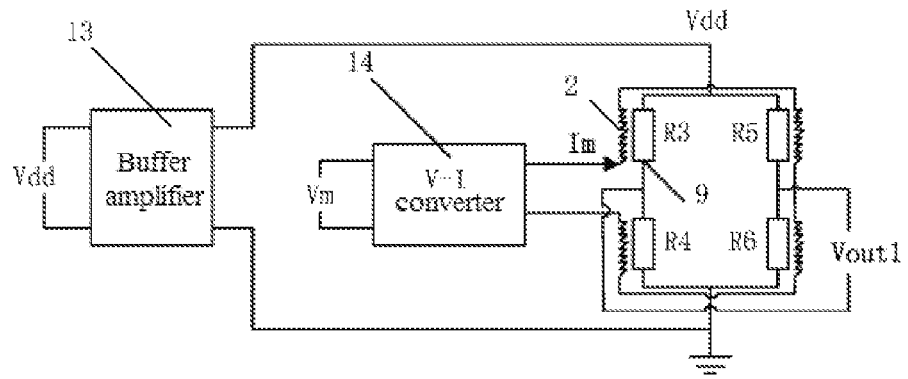
FIG. 18 is a view of a signal processing circuit of the mixer when the magnetoresistive mixer of the present invention uses active coil signals, active power signals, and passive output signals.

FIG. 18 is a view of another signal processing circuit of the magnetoresistive mixer, wherein f1 is the frequency of the first frequency signal source, input in an active form, and the signal processing circuit converts a voltage signal to a current signal through a V-I converter 14 that is connected between the two ends of the spiral coil 2, the second frequency signal source of frequency f, is input in an active form, through a buffer amplifier 13 and the power source and ground ports of the bridge-type magnetoresistive sensor 9, and the mixing signal is output through the signal output end of the bridge-type magnetoresistive sensor 9 directly in a passive form.

Figure 19:
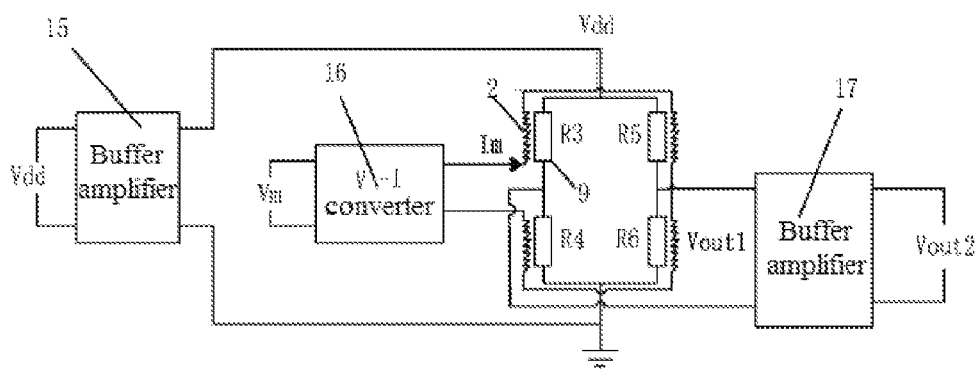
FIG. 19 is a view of a signal processing circuit of the mixer when the magnetoresistive mixer of the present invention uses active coil signals, active power signals, and active output signals.

FIG. 19 is a view of a third signal processing circuit of the magnetoresistive mixer, wherein the first frequency signal source of frequency f1, input in active form, and the signal processing circuit converts a voltage signal to a current signal through a V-I converter 16 to be connected with two ends of the spiral coil 2, the second frequency signal source with frequency f, input in an active form through a buffer amplifier 15 and the power source and ground ports of the bridge-type magnetoresistive sensor 9, and the mixing signal is actively output through a buffer voltage amplifier 17.

Figure 20:
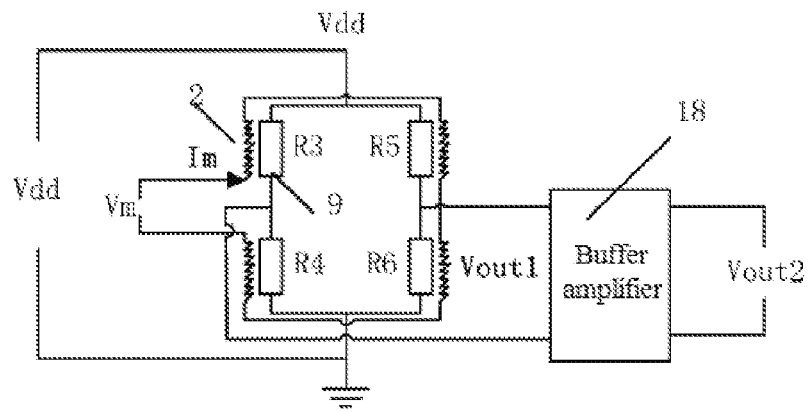
FIG. 20 is a view of a signal processing circuit of the mixer when the magnetoresistive mixer of the present invention uses passive coil signals, passive power signals, and active output signals.

FIG. 20 is a view of a fourth signal processing circuit of the magnetoresistive mixer, wherein f1 of the first frequency signal source is connected with two ends of the spiral coil 2 in an active manner, f of the second frequency signal source is input through the power source-ground port of the bridge-type magnetoresistive sensor 9 in an active manner, and the mixing signal is output through a buffer voltage amplifier 18 indirectly in an active form.

The above descriptions are merely preferred embodiments of the present invention, but are not intended to limit the present invention. For persons skilled in the art, the present invention may have various modifications and changes. Any modification, equivalent replacement, improvement and the like made within the spirit and principle of the present invention shall be included in the protection scope of the present invention.

The invention claimed is:

1. A magnetoresistive mixer, for mixing a first frequency signal source input and a second frequency signal source input to obtain a mixing signal, the magnetoresistive mixer comprising:
   a spiral coil,
   a bridge-type magnetoresistive sensor and
   a magnetic shielding layer,
   wherein the spiral coil is located between the magnetic shielding layer and the bridge-type magnetoresistive sensor;
   wherein the bridge-type magnetoresistive sensor comprises four magnetoresistive sensor units forming a bridge-type structure, the magnetoresistive sensor units being respectively located, in pairs, in two regions above or below the spiral coil having opposite current directions;
   wherein each of the magnetoresistive sensor units comprises N array-type magnetic tunnel junction rows, wherein each array-type magnetic tunnel junction row consists of M magnetic tunnel junctions, M and N are both positive integers, the array-type magnetic tunnel junction rows are connected in series connection, parallel connection, or combination of series connections and parallel connections to form two port structures, and sensing axes of the magnetic tunnel junctions are perpendicular to the current directions in the spiral coil within the region where the magnetoresistive sensor unit is located;

wherein, in two of the regions, distribution characteristics of magnetic fields in directions of the sensing axes of the magnetic tunnel junctions in the magnetoresistive sensor units are opposite, while in one of the regions, distribution characteristics of magnetic fields in directions of the sensing axes of the magnetic tunnel junctions in the magnetoresistive sensor units are the same;

wherein the first frequency signal source is input through the spiral coil, so as to convert the first frequency signal source to a magnetic field signal having the same frequency as that of a magnetic field in the direction of the sensing axis of the magnetic tunnel junctions and act upon the magnetic tunnel junctions, causing resistances of the magnetoresistive sensor units to change, and the second frequency signal source is input through the power source and ground ports of the bridge-type magnetoresistive sensor, causing voltages on two ends of the magnetoresistive sensor units to change; and wherein the mixing signal is output through a signal output end of the bridge-type magnetoresistive sensor, and a signal frequency of the output mixing signal is the sum or the difference of frequencies of the first frequency signal source and the second frequency signal source.

2. The magnetoresistive mixer according to claim 1, wherein the four magnetoresistive sensor units have the same magnetoresistive response characteristics.

3. The magnetoresistive mixer according to claim 1, wherein the magnetoresistive sensor units located in two regions above or below the spiral coil having opposite current directions have the same magnetic tunnel junction connection structure, and are opposite in phase.

4. The magnetoresistive mixer according to claim 1, wherein, within a range of a magnetic field in the direction of the sensing axis of magnetic tunnel junctions produced by the first frequency signal source through the spiral coil, resistances of the magnetic tunnel junctions in the magnetoresistive sensor units are linearly proportional to the external magnetic fields.

5. The magnetoresistive mixer according to claim 1, wherein a magnetic field in the direction of the sensing axis of the array-type magnetic tunnel junction rows in the magnetoresistive sensor units located above or below the spiral coil has uniform or non-uniform magnetic field distributions.

6. The magnetoresistive mixer according to claim 1, wherein the array-type magnetic tunnel junction rows of the magnetoresistive sensor units located in the regions above or below the spiral coil are perpendicular or parallel to the current directions in the spiral coil within the regions.

7. The magnetoresistive mixer according to claim 1, wherein the first frequency signal source is connected with the spiral coil in an active or passive manner.

8. The magnetoresistive mixer according to claim 1, wherein the second frequency signal source is connected between a voltage port and a-ground port of the bridge-type magnetoresistive sensor in a passive or active manner.

9. The magnetoresistive mixer according to claim 1, wherein the mixing signal is output from the signal output end of the bridge-type magnetoresistive sensor in a passive or active manner.

10. The magnetoresistive mixer according to claim 1, wherein the spiral coil is made of a high conductivity metal material such as copper, gold or silver.

11. The magnetoresistive mixer according to claim 1, wherein the magnetic shielding layer is composed of a material selected from one of the high permeability ferromagnetic alloys NiFe, CoFeSiB, CoZrNb, CoFeB, FeSiB and FeSiBNbCu.

12. The magnetoresistive mixer according to claim 1, wherein the spiral coil has a thickness of 1 µm to 20 µm and a width of 5 µm to 40 µm, and the spacing between two adjacent single coils is 10 µm to 100 µm.

13. The magnetoresistive mixer according to claim 1, wherein the magnetic shielding layer has a thickness of 1 µm to 20 µm.

* * * * *

UNITED STATES PATENT AND TRADEMARK OFFICE
CERTIFICATE OF CORRECTION

PATENT NO. : 9,768,726 B2  
APPLICATION NO. : 14/907060  
DATED : September 19, 2017  
INVENTOR(S) : Zhou et al.

Page 1 of 1

It is certified that error appears in the above-identified patent and that said Letters Patent is hereby corrected as shown below:

On the Title Page

In item (30), in "Foreign Application Priority Data", in Column 1, Line 1, delete "2013 1 0313538" and insert --201310313538.3-- therefor Signed and Sealed this  
Twenty-eighth Day of May, 2019

Andrei Iancu  
*Director of the United States Patent and Trademark Office*